United States Patent
Ohashi et al.

(10) Patent No.: US 6,861,925 B2
(45) Date of Patent: Mar. 1, 2005

(54) SURFACE ACOUSTIC WAVE FILTER

(75) Inventors: Wataru Ohashi, Kanagawa (JP); Hisanori Ehara, Tokyo (JP); Tomokazu Komazaki, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 25 days.

(21) Appl. No.: 10/273,888

(22) Filed: Oct. 21, 2002

(65) Prior Publication Data

US 2003/0098756 A1 May 29, 2003

(30) Foreign Application Priority Data

Oct. 26, 2001 (JP) .................................... 2001/328702

(51) Int. Cl.$^7$ .............................. H03H 9/73; H03H 9/64
(52) U.S. Cl. ..................................... 333/133; 333/193
(58) Field of Search ..................... 333/133, 193–196

(56) References Cited

U.S. PATENT DOCUMENTS

| | | | | |
|---|---|---|---|---|
| 5,554,960 A | * | 9/1996 | Ohnuki et al. | 333/132 |
| 5,786,738 A | * | 7/1998 | Ikata et al. | 333/133 |
| 6,208,223 B1 | | 3/2001 | Shimamura et al. | 333/193 |
| 6,222,426 B1 | * | 4/2001 | Komazaki et al. | 333/133 |
| 6,351,194 B2 | * | 2/2002 | Takahashi et al. | 333/133 |
| 6,373,350 B1 | * | 4/2002 | Fujita | 333/133 |
| 6,380,823 B1 | * | 4/2002 | Ikata et al. | 333/133 |
| 6,501,344 B2 | * | 12/2002 | Ikata et al. | 333/133 |

FOREIGN PATENT DOCUMENTS

| | | |
|---|---|---|
| JP | 06-029779 | 2/1994 |
| JP | 07-074584 | 3/1995 |
| JP | 09-205343 | 8/1997 |
| JP | 9-270604 | * 10/1997 |
| JP | 10-233648 | * 9/1998 |
| JP | 11-251871 | 9/1999 |

* cited by examiner

Primary Examiner—Barbara Summons
(74) Attorney, Agent, or Firm—Volentine Francos & Whitt, PLLC

(57) ABSTRACT

A surface acoustic wave filter includes an antenna terminal, an antenna, a transmitting filter, a branching line and a receiving filter. The antenna is coupled to the antenna terminal. The transmitting filter is coupled to the antenna terminal. The transmitting filter receives an electrical power. The branching line is coupled to the antenna terminal. The branching line has a first length that is longer than $\lambda/4$ length so that the electrical power received by the transmitting filter when the antenna terminal is opened is smaller than when the antenna terminal is terminated, wherein $\lambda$ is a wave length of a center frequency of transmitted and received bands of the surface acoustic wave filter. The receiving filter is coupled to the branching line.

22 Claims, 10 Drawing Sheets

SURFACE ACOUSTIC WAVE FILTER

BACKGROUND OF THE INVENTION

1. Field of the Invention

The present invention relates to a surface acoustic wave filter using a ladder type band pass filter that uses a surface acoustic wave resonator in small mobile communication equipment such as portable telephones, specifically to a surface acoustic wave filter that can be used even with a high power applied.

2. Description of the Background Art

There have been keen and energetic developments of small and lightweight mobile communication terminals such as portable telephones. The developments have involved demands for smaller parts and higher performances of the components used. These demands result in developments of RF (radio frequency) components using the surface acoustic wave (SAW) filter, which are used in practice. The SAW filter is a device that makes a great contribution to miniaturization of the RF units, which has been actively developed and used partly in some areas.

The recent improvements of performances in the mobile communication terminals have led to a demand for a high performance SAW branching filter that has a still lower insertion loss in the pass band and a higher attenuation in the attenuation band. The SAW branching filter is composed of a Tx filter (transmitting filter), Rx filter (receiving filter), and branching line, so that the transmission signal and reception signal may not interfere in branching and generating signals in the mobile communication terminals.

Especially, in the SAW branching filter for mobile communication terminals, the SAW filter is preferred not to have deterioration of the characteristics even when a high power is applied thereto. The SAW filter that can handle a high power is disclosed, for example, in the Japanese Laid-Open Patent Publication No. H 7-74584, No. H 6-29779, No. H 9-205343, and No. H 11-251871. These publications disclose the SAW filter that decreases the current value per unit area by increasing the cross length and number of cross couples of the SAW resonator, so as to cope with a higher power.

However, when the SAW filter capable of handling a high power is employed for the SAW branching filter, and has a high power inputted thereto, there can be created a deterioration of the branching filter characteristics. There are inevitably large variations of the antenna impedance in the mobile communication terminals. Accordingly, there arises a problem of characteristic deterioration by the variations of the antenna impedance. That is, in either case of the antenna terminal and the receiver terminal being terminated with 50Ω, and the antenna terminal and the receiver terminal being opened, it is preferred that there do not occur characteristic variations. However, when the antenna terminal and the receiver terminal are opened, there is a generally known problem of characteristic deterioration of the Tx filter or a signal disconnection by series arm destruction.

In the mobile communication terminals such as portable telephones, the SAW branching filter is requested to have the function that uses one antenna for both transmission and reception, and further to have the following function. That is, the filter is requested to satisfy the required characteristics in the following cases:

(1) when the antenna is normally operated, namely, when the antenna impedance is 50Ω, and
(2) when the antenna is opened, namely, when the antenna impedance is infinite.

In the aspect of change in the foregoing two cases, the impedance varies sharply. During the transmission having a power applied to the SAW branching filter, there is a possibility that can produce a characteristic variation or a destruction of the SAW branching filter.

SUMMARY OF THE INVENTION

In view of the foregoing circumstances, the invention provides a surface acoustic wave branching filter that does not greatly vary the power applied to each resonator in the transmitting filter of the surface acoustic wave branching filter, in both states of the antenna terminal being opened and the antenna terminal being terminated.

A surface acoustic wave filter of the present invention includes an antenna terminal, an antenna, a transmitting filter, a branching line and a receiving filter. The antenna is coupled to the antenna terminal. The transmitting filter is coupled to the antenna terminal. The transmitting filter receives an electrical power. The branching line is coupled to the antenna terminal. The branching line has a first length that is longer than $\lambda/4$ length so that the electrical power received by the transmitting filter when the antenna terminal is opened is smaller than when the antenna terminal is terminated, wherein $\lambda$ is a wave length of a center frequency of transmitted and received bands of the surface acoustic wave filter. The receiving filter is coupled to the branching line.

DETAILED DESCRIPTION OF THE PREFERRED EMBODIMENTS

The invention will be described in detail with reference to the accompanying drawings.

Figure 1:
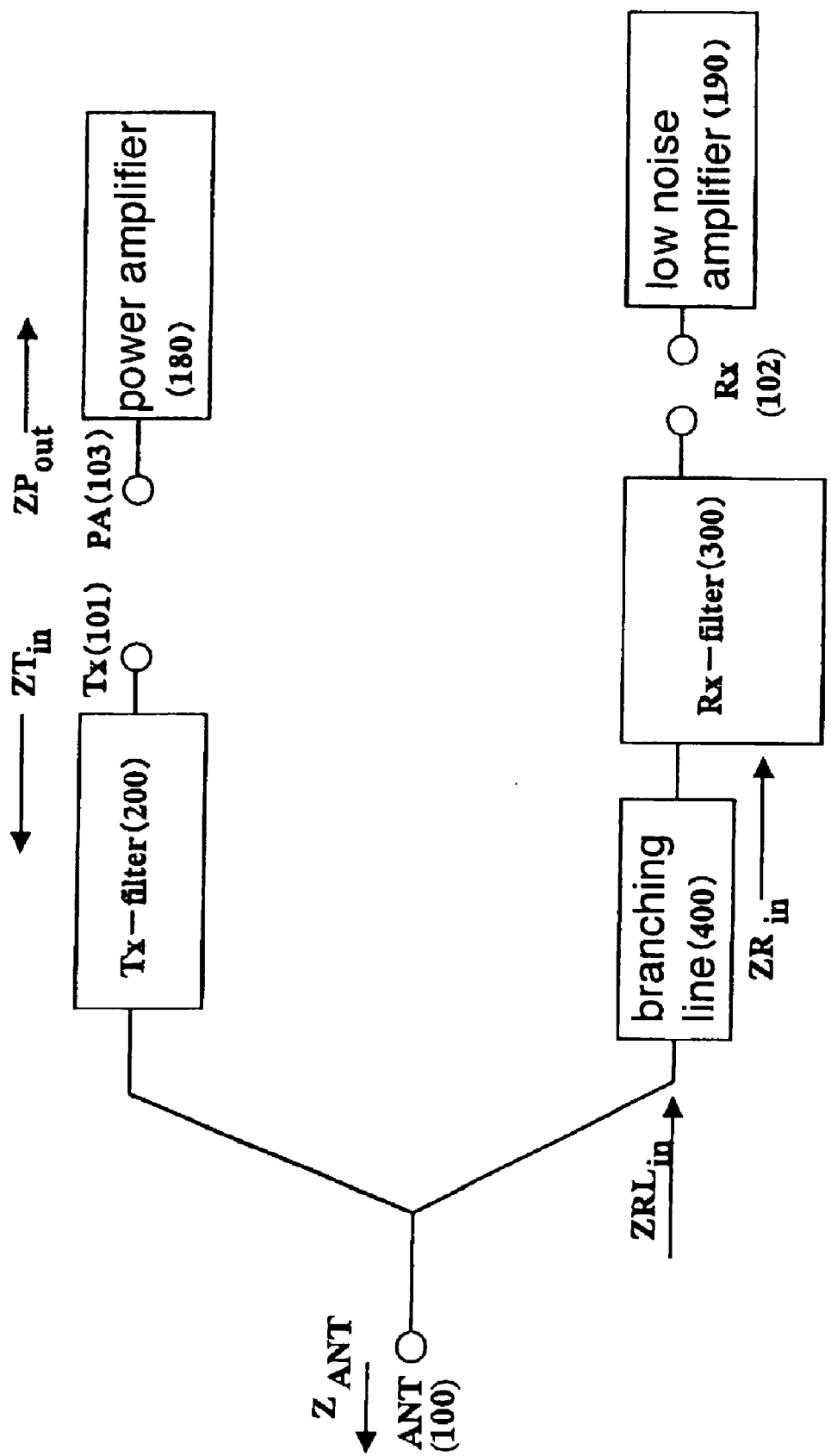
FIG. 1 is a circuit block diagram of the first embodiment according to the invention.

FIG. 1 is the circuit block diagram relating to the first embodiment of the invention.

In FIG. 1, in the mobile communication terminals such as portable telephones, normally the output impedance ZPout at the output terminal (PA terminal) (103) of a power amplifier (180) is defined as 50Ω. It is generally known that the output power of the power amplifier (180) is the sum of a power inputted into the Tx filter (200) from the Tx terminal (101) of the SAW branching filter and a power reflected to the PA terminal (103) of the power amplifier (180) from the Tx terminal (101) of the SAW branching filter, on the basis of the relation between the input impedance ZTin of the Tx filter and the output impedance ZPout of the power amplifier (180).

In the mobile communication terminals such as portable telephones in FIG. 1, the input impedance Zant of an antenna (170) connected to the antenna terminal (ANT terminal) (100) is designed as 50Ω. However in practice, it is known that the impedance varies from 50Ω to infinite. As already mentioned, the characteristics required to the SAW branching filter is defined to satisfy the required characteristics in the range of the impedance Zant of the antenna (170), from 50Ω to infinite.

Figure 9:
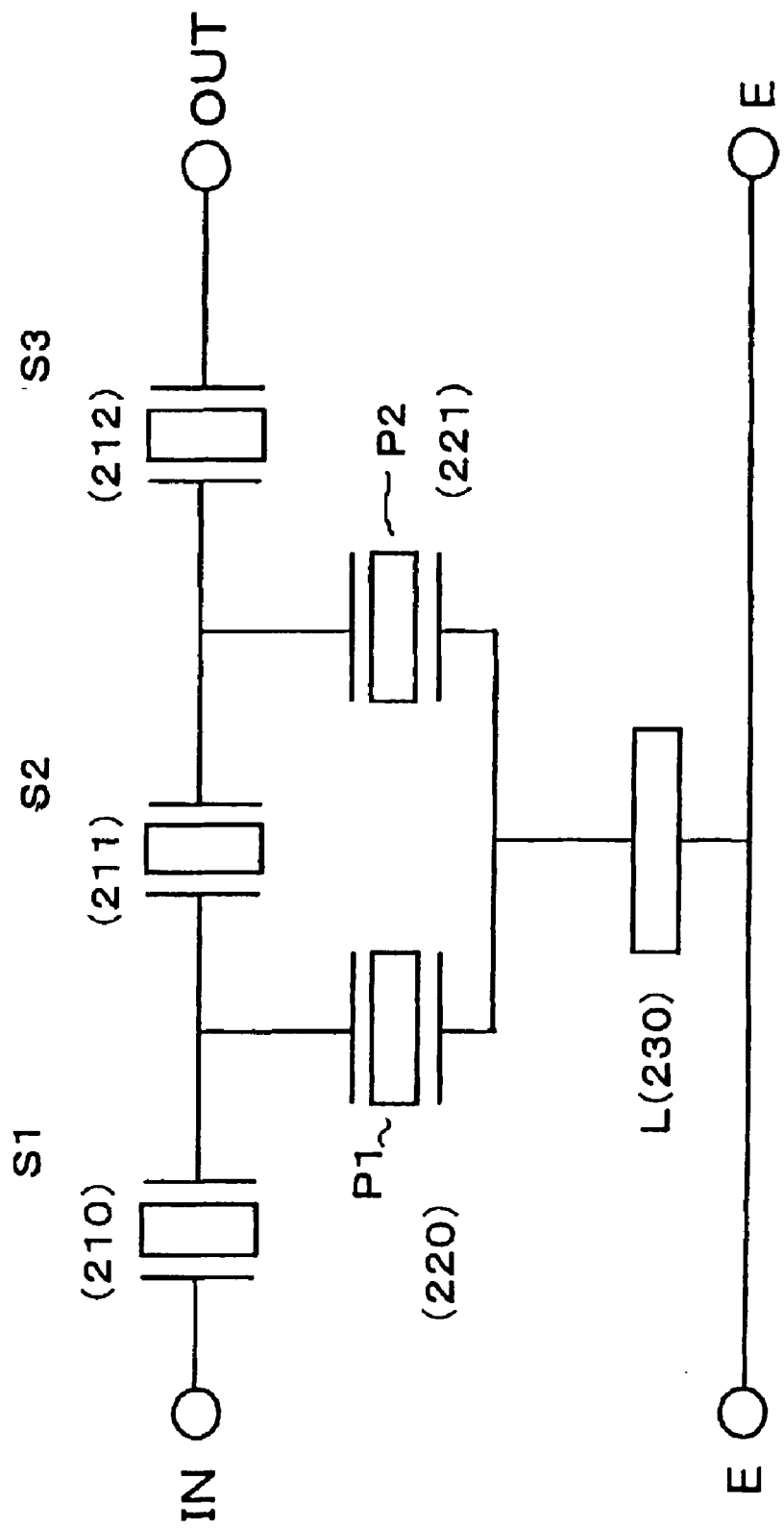
FIG. 9 is a circuit block diagram of the Tx filter.

FIG. 9 is the circuit block diagram of the Tx filter (200).

The Tx filter (200) in FIG. 1 is a four-stage T-type ladder filter composed of three series arms and two parallel arms, as shown in FIG. 9, and the cross length and number of cross couples thereof are shown in Table 1.

Figure 3:
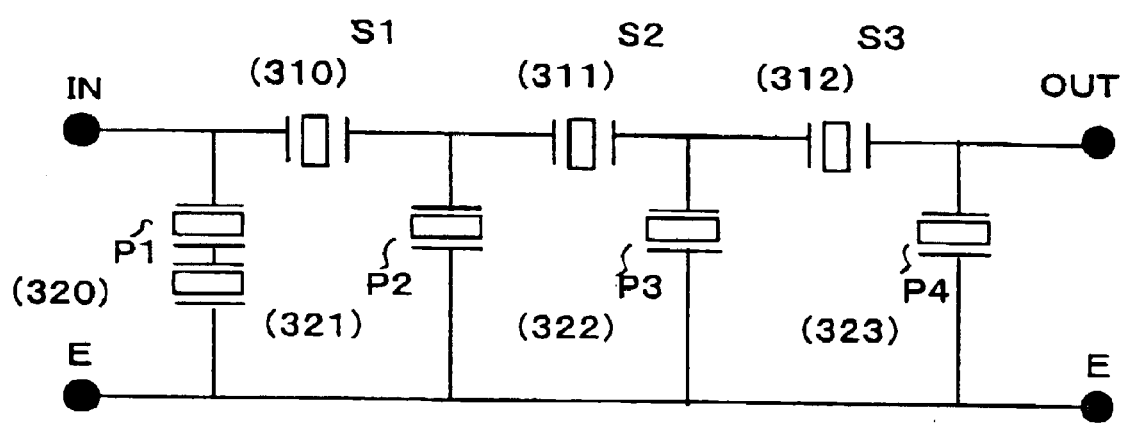
FIG. 3 is a circuit block diagram of a RX filter.

FIG. 3 is the circuit block diagram of the RX filter (300).

The Rx filter (300) is a six-stage π-type filter composed of three series arms and four parallel arms, as shown in FIG. 3, and the cross length and number of cross couples thereof are shown in the Table 2.

Figure 7:
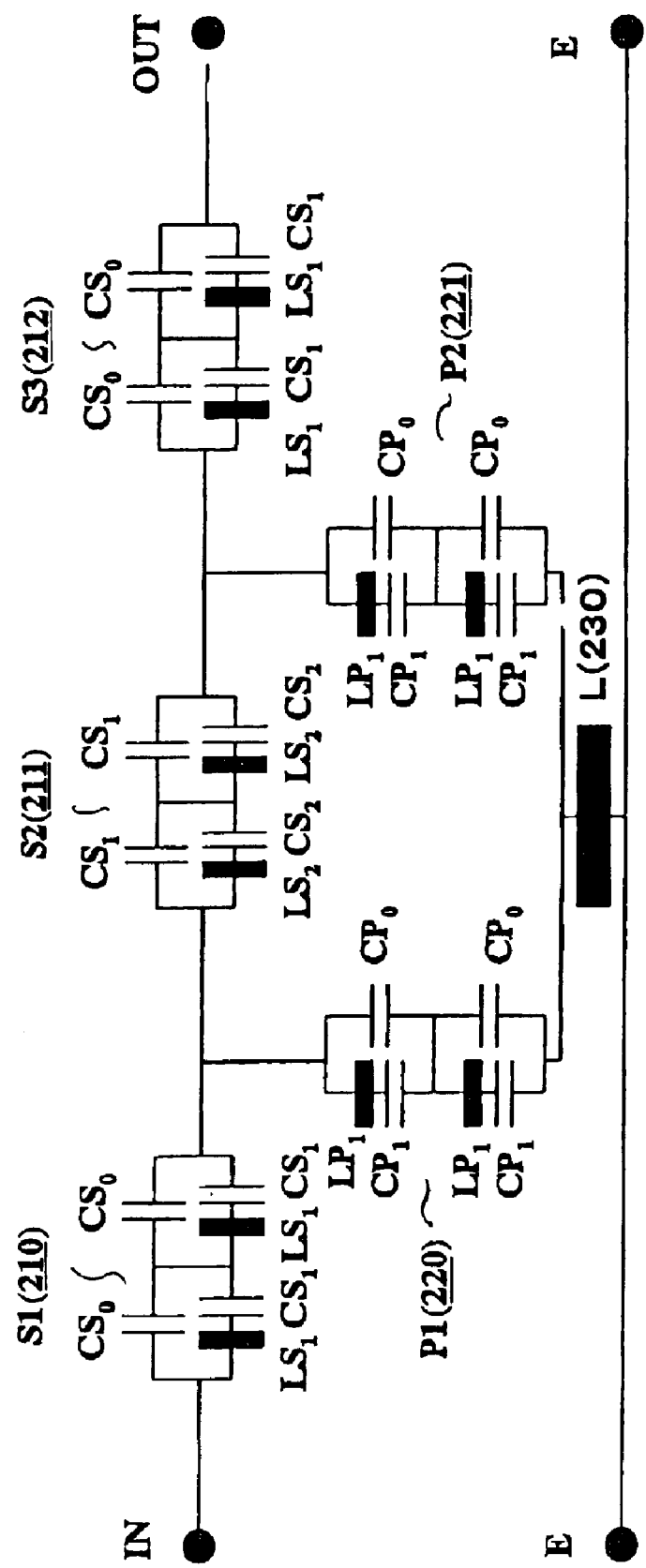
FIG. 7 is an equivalent lumped parameter circuit of a Tx filter.

FIG. 7 is the equivalent lumped parameter circuit of the Tx filter (200).

Figure 8:
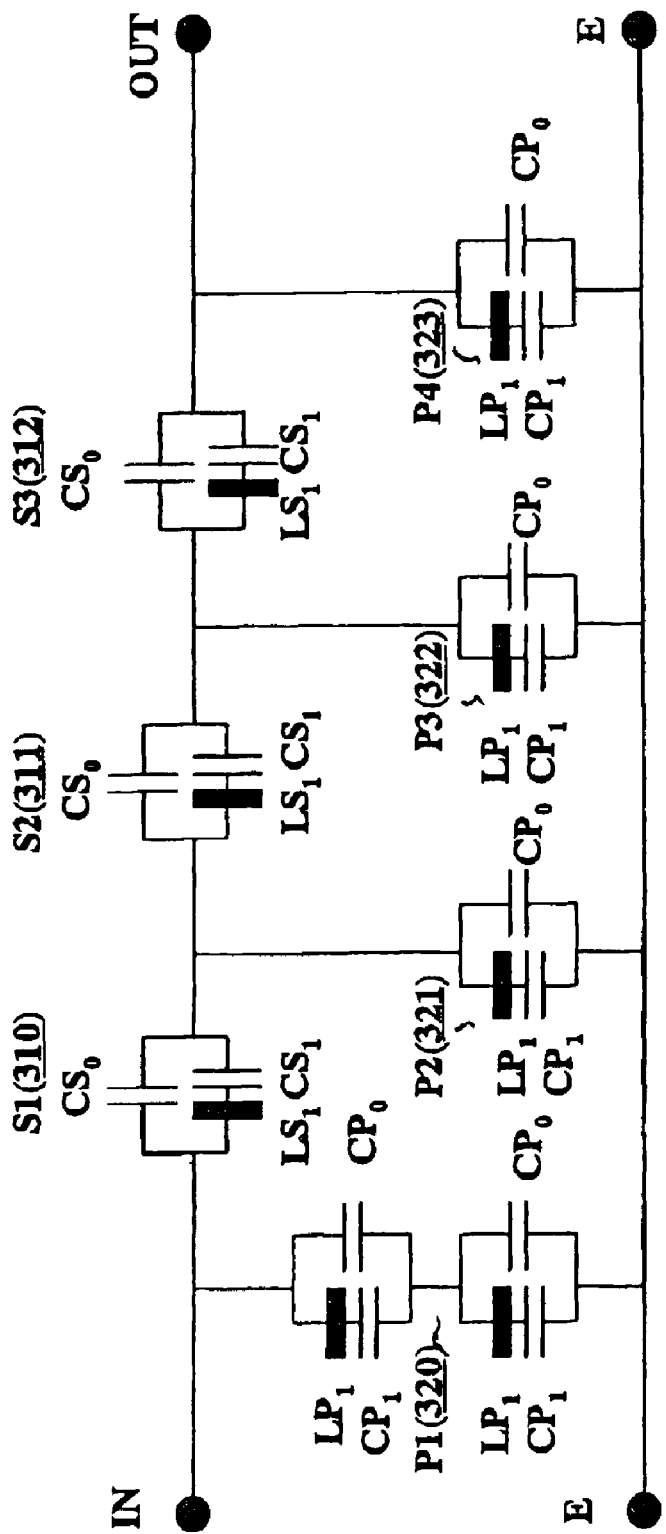
FIG. 8 is an equivalent lumped parameter circuit of the Rx filter.

FIG. 8 is the equivalent lumped parameter circuit of the Rx filter (300).

The equivalent LC values of the series arms and the parallel arms in FIG. 7 and FIG. 8 are shown in Table 1.

line (400), and decreases the power applied to each resonator in the range of the impedance Zant from 50Ω to infinite.

In the mobile communication terminals such as portable telephones, normally, the output impedance ZPout at the output terminal (PA terminal) (103) of the power amplifier (180) is defined as 50Ω. It is generally known that the output power of the power amplifier (180) is reduced to a power inputted into the Tx filter (200) from the Tx terminal (101) of the Tx filter (200) of the SAW branching filter and a power reflected to the PA terminal (103) of the power amplifier (180) from the Tx terminal (101) of the SAW branching filter, on the basis of the relation between the input impedance ZTin of the Tx filter (200) and the output impedance ZPout of the power amplifier (180), at the Tx terminal (101) of the Tx filter (200) of the SAW branching filter.

The impedance Zant of the antenna connected to the ANT terminal (100) in the mobile communication terminals such as portable telephones usually varies from 50Ω to infinite. As already mentioned, the characteristics required to the SAW branching filter is defined to satisfy the required characteristics in the range of the impedance Zant from 50Ω to infinite.

Thus, it is necessary to give attention to a power inputted to the Tx terminal (101) during transmission of signals. From FIG. 1, the power inputted into the Tx filter (200) is related to the input impedance ZTin of the Tx filter (200). That is, during transmission, the load at the ANT terminal (100) becomes a state that the impedance Zant of the antenna (170) and the impedance ZRLin of the reception system composed of the branching line (400) and the Rx filter (300)

TABLE 1

Cross length, number of couples, equivalent LC values, and impedance values at 836 MHz of the transmitting filter.

| Transmitting filter | Series arm 1 | Series arm 2 | Series arm 3 | Parallel arm 1 | Parallel arm 2 | Parallel arm 3 | Parallel arm 4 |
|---|---|---|---|---|---|---|---|
| Cross length | 90μ | 45μ | 90μ | | 125μ | 125μ | |
| number of couples | 100 couples | 100 couples | 100 couples | | 85 couples | 85 couples | |
| L1 (nH) | 153 | 306 | 153 | | 87.5 | 87.5 | |
| C1 (pF) | 0.237 | 0.118 | 0.237 | | 0.441 | 0.441 | |
| C0 (pF) | 2.96 | 1.48 | 2.96 | | 3.71 | 3.71 | |

TABLE 2

Cross length, number of couples, equivalent LC values, and impedance values at 836 MHz of the receiving filter.

| Receiving filter | Series arm 1 | Series arm 2 | Series arm 3 | Parallel arm 1 | Parallel arm 2 | Parallel arm 3 | Parallel arm 4 |
|---|---|---|---|---|---|---|---|
| Cross-length | 50μ | 50μ | 50μ | 70μ | 99μ | 99μ | 70μ |
| number of couples | 100 couples | 100 couples | 100 couples | 70 couples | 99 couples | 99 couples | 70 couples |
| L1 (nH) | 159 | 159 | 159 | 194 | 97 | 97 | 194 |
| C1 (pF) | 0.201 | 0.201 | 0.201 | 0.181 | 0.362 | 0.362 | 0.181 |
| C0 (pF) | 2.51 | 2.51 | 2.51 | 1.77 | 3.55 | 3.55 | 1.77 |
| Q | 800 | 800 | 800 | 800 | 800 | 800 | 800 |

The SAW branching filter relating to the first embodiment of the invention is designed, as illustrated in FIG. 1, so as to decrease the power inputted to the Tx filter (200) in the range of the impedance Zant from 50Ω to infinite. In other words, the SAW branching filter is characterized by providing a power variable means that decreases the power inputted to the Tx filter (200) by varying the line length of the branching are connected in parallel. Therefore, in the following two states, it is desired to suppress the variation of the input impedance ZTin of the Tx filter (200) as much as possible.

(1) when the antenna (170) is normally operated, namely, when the input impedance of the antenna (170) is 50Ω, and (2) when the antenna (170) is opened, namely, when the input impedance of the antenna (170) is infinite. In order to satisfy this condition, it is understood that the impedance of the case (2) should necessarily be varied.

That is, the load in the case (1) includes, when the transmission power from the power amplifier (180) is applied, the impedance Zant of the antenna (170) viewed from the ANT terminal (100) and the input impedance ZRLin of the Rx system composed of the branching line (400) and the Rx filter (300). In the case (2), since the impedance Zant becomes ∞, the load only includes the input impedance ZRLin of the Rx system composed of the branching line (400) and the Rx filter (300). On the calculation, various conditions will be added so as to find the input impedance ZRLin that the synthetic impedance at the ANT terminal (100) in the case (1), when the terminate resistance of the antenna (170) and the input impedance ZRLin are connected in parallel, becomes equal to the impedance of the input impedance ZRLin in the case (2).

Here is a problem that the power applied to each of the resonators (210, 211, 212, 220, 221) constituting the Tx filter (200) is increased. Each of the resonators inevitably possesses a resistance by a finite Q-factor. The resistance is produced between the comb teeth of the resonator, and currents are flown into the resistance, which generates a heat in the resonator. This heat will destroy the resonator.

Figure 4:
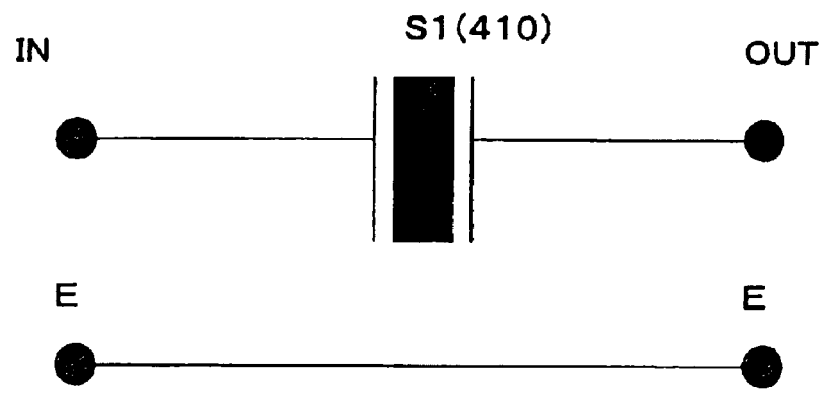
FIG. 4 is a basic circuit of a series arm SAW filter.

FIG. 4 is a basic circuit of a series arm SAW filter.

Figure 5:
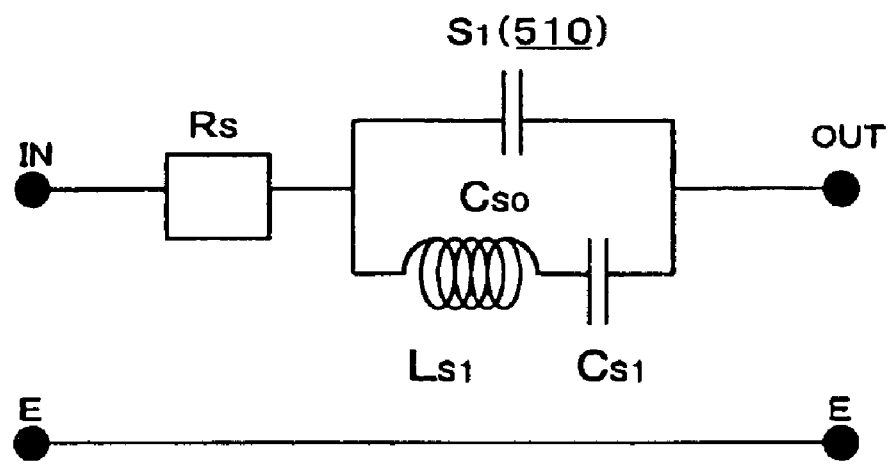
FIG. 5 is an equivalent lumped parameter circuit of the series arm SAW filter.

FIG. 5 is the equivalent lumped parameter circuit of the series arm SAW filter.

The resistance by a finite Q-factor of this resonator is Rs illustrated in FIG. 5 being the lumped parameter circuit of the SAW filter in FIG. 4, which is calculated as follows.

The resistance by a finite Q-factor of the resonator is calculated from the lumped parameter circuit of the resonator, as follows. Now, provided that the Q-factor of the resonator is finite and is given by $Q_0$, the impedance Z of the series arm resonator including $Q_0$, and the admittance Y of the parallel arm resonator will be given by the expression (1).

$$Z = 1/Y = R_d + jZ_0 = 1/(G_d + jY_0) \quad (1)$$

$$G_d = \{\omega C_0 + \omega C_1(1 + \omega^2 \ast L_1 \ast C_1)\}/\{(1-\omega^2 \ast L_1 \ast C_1)^2\}/Q_0 \quad (2)$$

$$Y_0 = \omega(C_0 + C_1 + \omega^2 \ast L_1 \ast C_1 \ast C_0)/(1 + \omega^2 \ast L_1 \ast C_1) \quad (3)$$

When the Q-factor of the resonator is infinite, the impedance of the series arm resonator is equal to $jZ_0$, and the admittance of the parallel arm resonator is equal to $jY_0$. However, the resonator has a finite Q-factor in practice, and there exist a minute resistance $R_d$ of the series arm resonator and a minute conductance $G_d$ of the parallel arm resonator.

Figure 10:
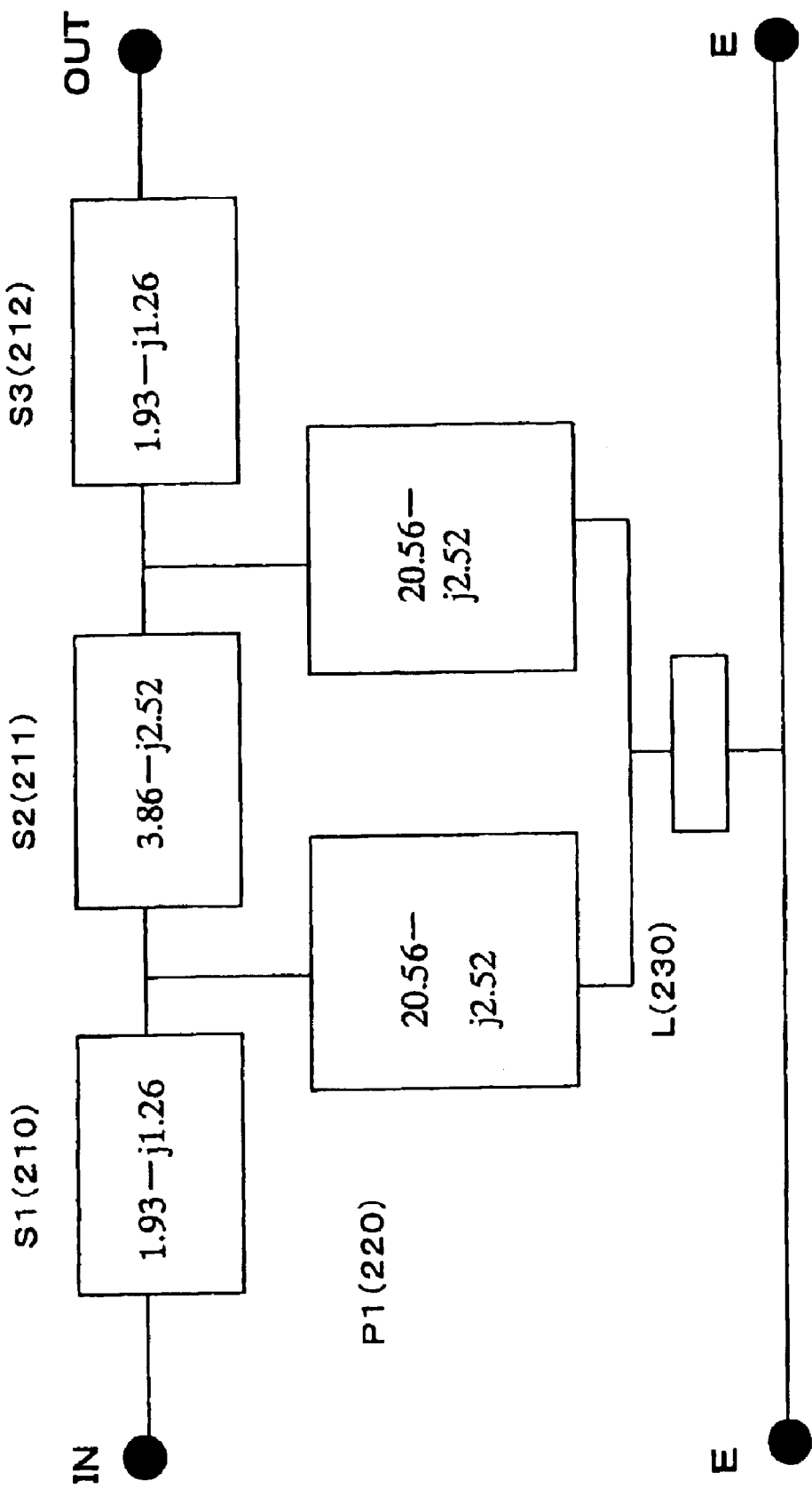
FIG. 10 is a chart illustrating the impedance values at 836 MHz in the equivalent lumped parameter circuit of the Tx filter.
Figure 11:
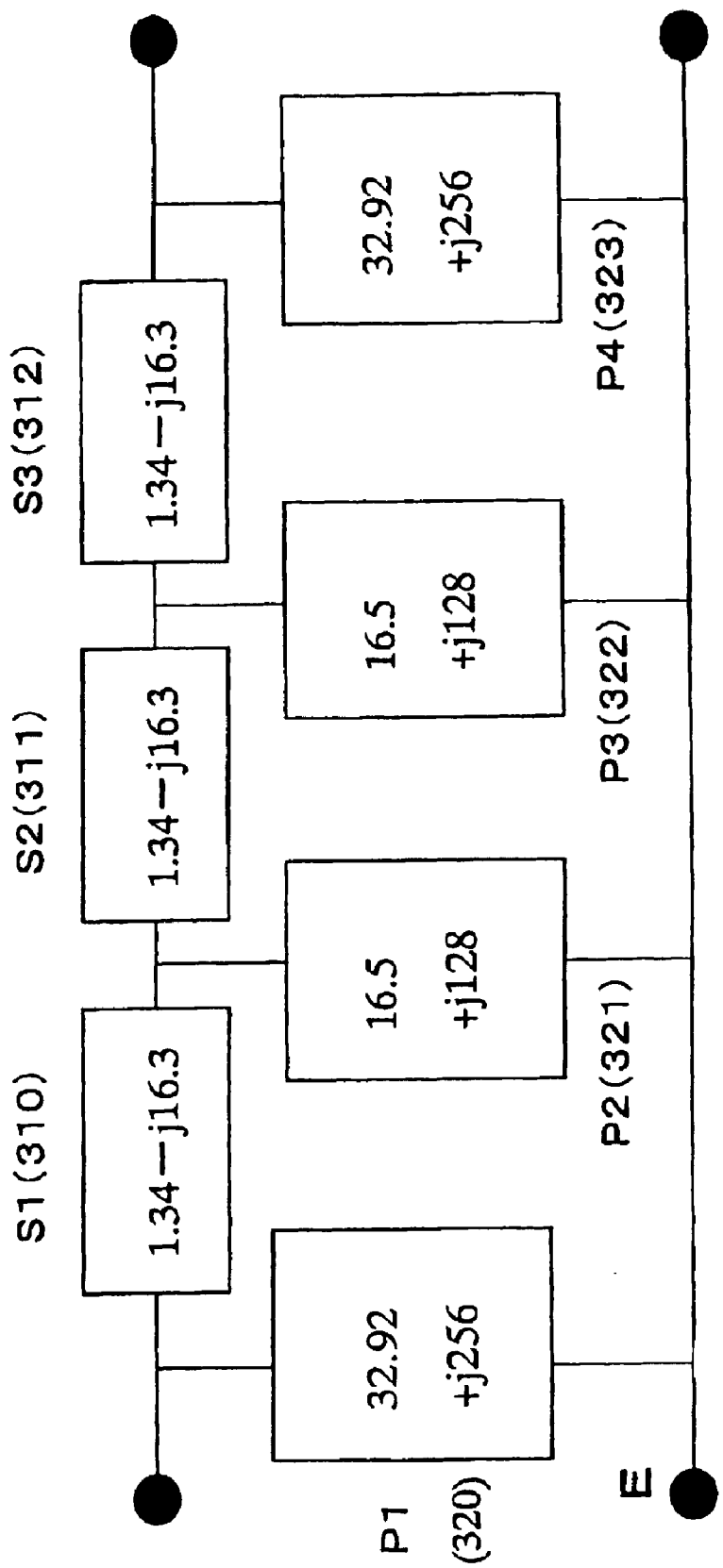
FIG. 11 is a chart illustrating the impedance values at 836 MHz in the equivalent lumped parameter circuit of the Rx filter.

FIG. 10 and FIG. 11 illustrate the resistance and conductance of the Tx filter (200) and the Rx filter (300). FIG. 10 illustrates the impedance values at 836 MHz on condition that the Q-factor of the series arm resonator of the Tx filter (200) is 800 and the Q-factor of the parallel arm resonator is 200. FIG. 11 illustrates the impedance values at 836 MHz on condition that the Q-factor of the series arm resonator of the Rx filter (300) is 800 and the Q-factor of the parallel arm resonator is 200.

Table 3 illustrates the variation of the input power to the Tx filter (200), as to the case with the ANT terminal (100) opened, which is calculated with the impedance values in FIG. 10, FIG. 11, by calculating the input impedance ZTin from the Tx terminal (101) with the line length of the branching line (400) as the parameter. Table 4 illustrates the powers applied to each of the resonators of the Tx filter (200) corresponding to each of the line lengths, which are calculated with the input impedance and input power of the Tx filter (200). Table 4 confirms that to elongate the line length of the branching line (400) will decrease the input current to the Tx filter (200), which involves decrease of the powers applied to each of the resonators of the Tx filter (200).

TABLE 3

The line length of the branching line against the input power of the Tx filter in the first embodiment of the invention

| | ZTin | ZRLin | Zrin | Line length | Tx filter input power with 1 Watt input at Tx terminal |
|---|---|---|---|---|---|
| 1 | 6.79 + j26.6 | 1.50 + j45.5 | 1.04 − j26.5 | 29.2 | 0.345 (Watt) |
| 2 | 8.48 + j33.6 | 2.19 + j64.7 | 1.04 − j26.5 | 33.3 | 0.372 |
| 3 | 113 + j41.3 | 3.79 + j95.4 | 1.04 − j26.5 | 37.75 (λ/4) | 0.414 |
| 4 | 16.0 + j49.9 | 8.91 − j23.8 | 1.04 − j26.5 | 29.2 | 0.468 |

TABLE 4

The powers of each arms of the Tx filter with the ANT terminal opened and terminated in the first embodiment of the invention

| | ANT terminal | Line length (mm) | Input impedance of Tx filter | | Input power at input terminal of Tx filter | | | Power applied to each arm of Tx filter | | | | |
|---|---|---|---|---|---|---|---|---|---|---|---|---|
| | | | Real | imaginary | Power | resistance | current | P1 | P2 | P3 | P4 | P5 |
| 1-1 | Opened | 29.2 | 6.79 | 26.6 | 0.35 | 6.79 | 0.266 | 0.098 | 0.026 | 0.139 | 0.005 | 0.058 |
| 1-2 | Opened | 37.75 | 11.3 | 40 | 0.42 | 11.3 | 0.19 | 0.072 | 0.019 | 0.102 | 0.004 | 0.042 |
| 1-3 | Opened | 41.7 | 16 | 49.9 | 0.468 | 16 | 0.17 | 0.056 | 0.015 | 0.08 | 0.003 | 0.033 |
| 2 | terminated | 37.75 | 25.4 | 19.8 | 0.84 | 25.4 | 0.18 | 0.064 | 0.025 | 0.068 | 0.004 | 0.024 |

That is, as shown in Table 3, as the line length of the branching line (400) is increased, the increase of the resistance is limited, but the increase of the reactance is significant; and therefore, the impedance value is increased owing to the increase of the reactance.

Accordingly, from Table 4, in case of the line length being 37.75 mm, on the conditions that the ANT terminal (100) is opened and terminated, the input impedances of the Tx filter (200) are 11.3Ω and 25.4Ω; and the input impedance of the Tx filter (200) is inclined to increase, as the line length increases. Therefore, to further increase the line length with the ANT terminal (100) opened will substantially equalize the input impedance of the Tx filter (200) in the two states that the ANT terminal is opened and terminated. Thus, the first embodiment of the invention uses the branching line with a long line length to decrease the input current to the Tx filter (200), thereby organizing a SAW branching filter with increased resistance against power.

According to the first embodiment, when the line length of the branching line is shortened from 41.7 mm to 29.2 mm in the state that the ANT terminal (100) is opened, Table 4 finds that the input current of the Tx filter (200) increases to 0.266 A from 0.17 A.

In this case, when the ANT terminal (100) is terminated, the input current of the Tx filter (200) is 0.18 A. This depends on the variation of the input impedance by the load impedance (impedance of the reception system) that is added in parallel to the ANT terminal (100), since the ANT terminal (100) is opened. As shown in Table 4, if the line length of the branching line is set to 41.7 mm, the input current of the Tx filter (200) is decreased to 0.17 A, and the powers applied to each of the resonators are decreased, thus the first embodiment will enhance the resistance against power of the SAW filter.

Figure 2:
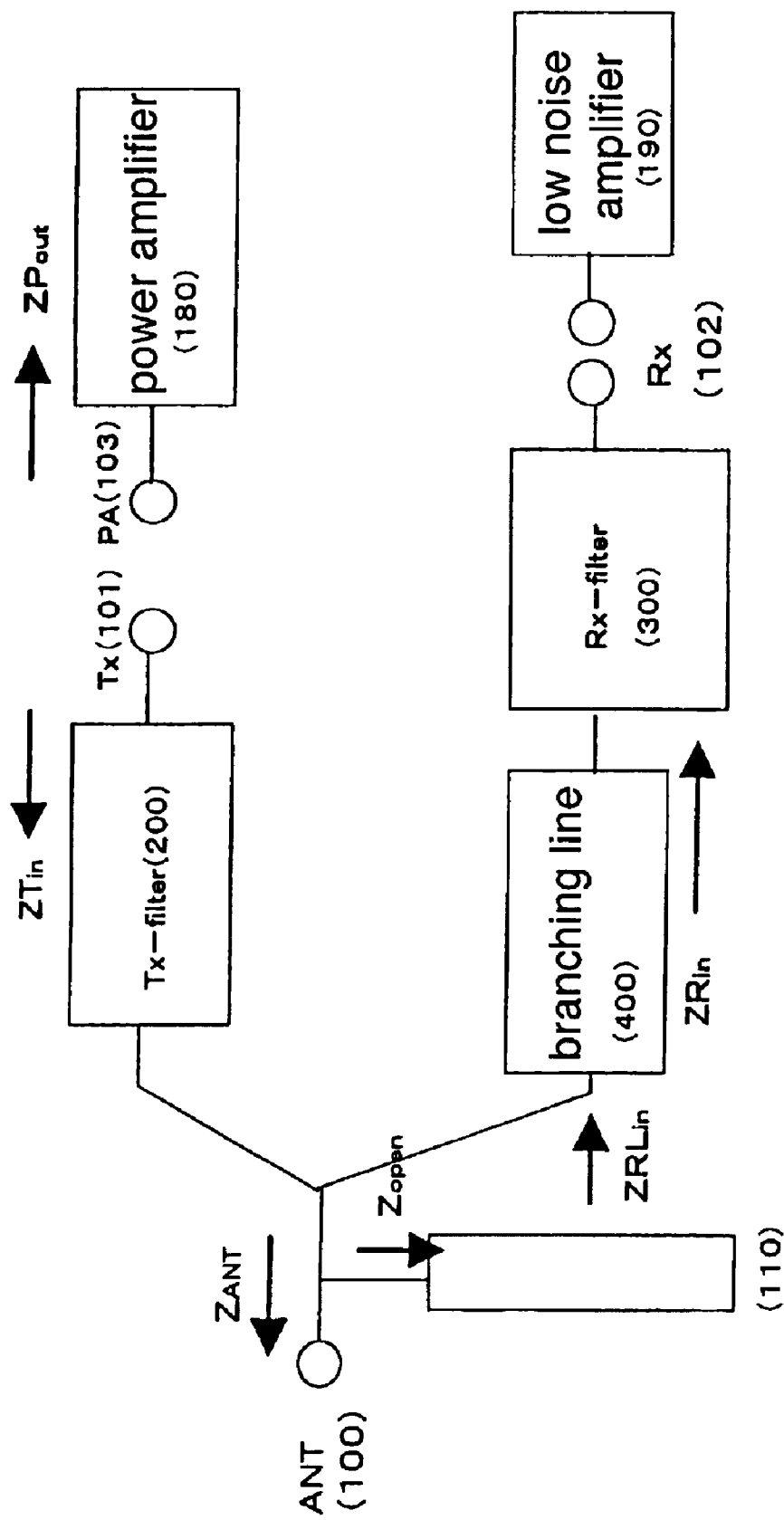
FIG. 2 is a circuit block diagram of a SAW branching filter of the second embodiment according to the invention.
Figure 6:
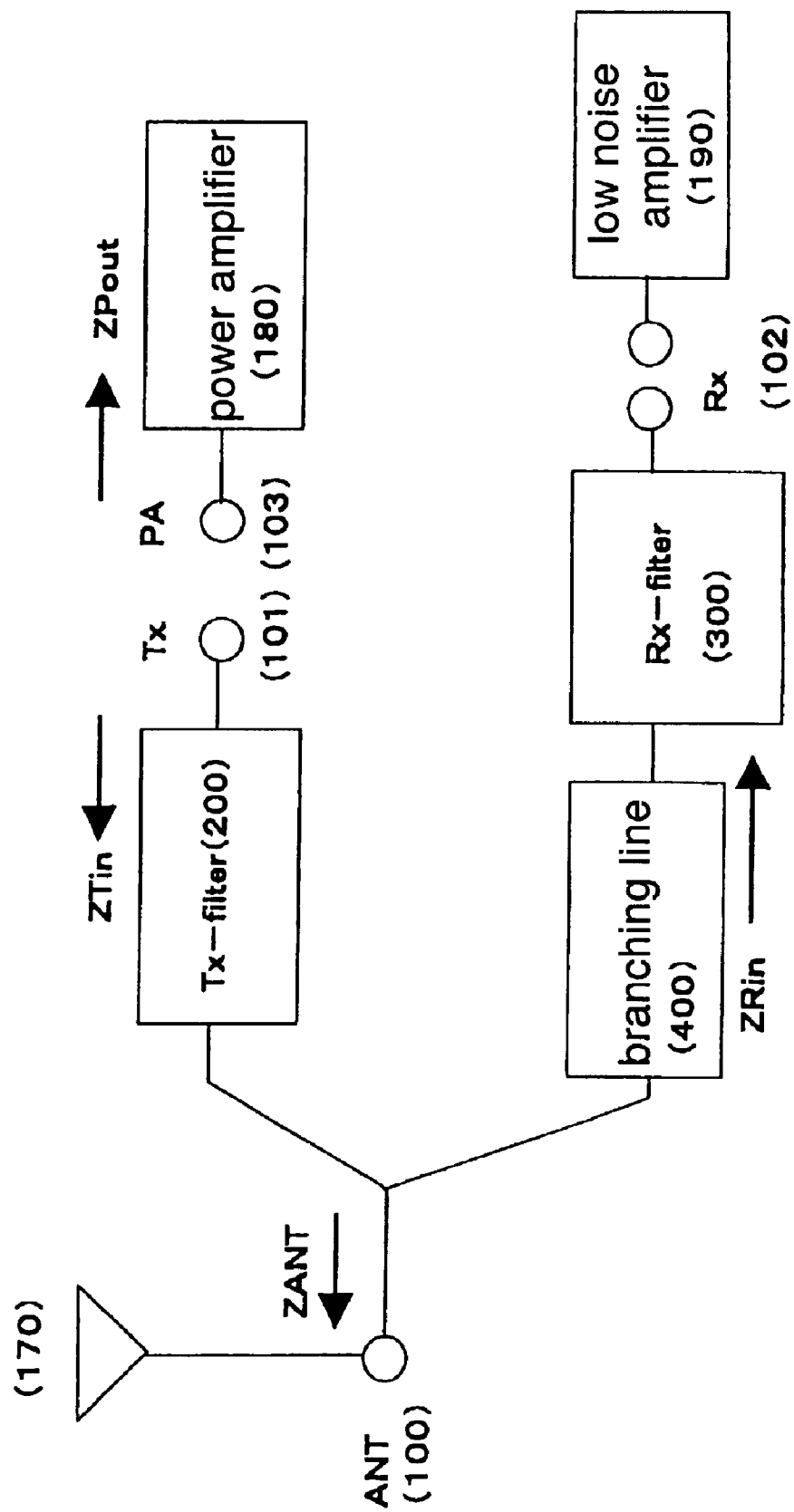
FIG. 6 is a circuit block diagram of the SAW branching filter that explains the invention.

FIG. 2 is a circuit block diagram of a SAW branching filter relating to the second embodiment of the invention. In the second embodiment, the circuit configuration of the SAW branching filter is the same as those of FIG. 1 and FIG. 6; and the difference from the first embodiment lies in a line (110) with its front end open, which is added to the ANT terminal (100). With regard to the transmission power supplied from the power amplifier (180) in the second embodiment, the load includes the impedance Zant of the antenna (170) viewed from the ANT terminal (100), the input impedance ZRLin of the Rx system composed of the branching line (400) and the Rx filter (300), and the impedance Zopen of the line (110) with its front end open.

In the second embodiment, the impedance Zopen of the line (110) with its front end open functions to make the input current of the Tx filter (200) determined by the input impedance ZTin of the Tx filter (200) with the ANT terminal (100) terminated greater than the input current of the Tx filter (200) determined by the input impedance ZTin of the Tx filter (200) with the ANT terminal (100) opened, thus making the power applied to each of the resonators of the Tx filter (200) with the ANT terminal (100) opened equal to or smaller than the power applied to each of the resonators of the Tx filter (200) with the ANT terminal (100) terminated. This power variable means makes up the SAW branching filter to enhance the resistance against power.

TABLE 5

The relation between the line length and the impedance at the frequency 836 MHz and the dielectric constant 5.7 of the line with its front end open

| Line length (mm) | 4.19 | 8.38 | 12.6 | 16.8 | 21 | 25.1 | 29.4 | 33.5 | 37.71 | 31.9 |
|---|---|---|---|---|---|---|---|---|---|---|
| Real part (Ω) | 0 | 0 | 0 | 0 | 0 | 0 | 0 | 0 | 0 | 0 |
| Imaginary part (Ω) | −282.6 | −136.9 | −86.3 | −59.3 | −41.7 | −28.6 | −17.9 | −8.58 | 0.251 | 9.1 |

The load to the transmission power from the power amplifier (180) in the second embodiment includes the impedance Zant of the antenna (170) viewed from the ANT terminal (100), the input impedance ZRLin of the Rx system composed of the branching line (400) and the Rx filter (300), and the impedance Zopen of the line (110) with its front end open. The impedance Zopen of the line (110) with its front end open is given by the expression (4).

$$Zopen = -jZ_0 \cot(\beta L) \qquad (4)$$

Table 5 illustrates the relation between the line length and the impedance in case of the frequency 836 MHz and the dielectric constant 5.7. As understood from Table 5, the impedance Zopen assumes negative values when the line length is shorter than λ/4 (=37.75 mm). This embodiment utilizes the characteristics that the Zopen becomes negative with the line length shorter than λ/4 (=37.75 mm).

Table 6 illustrates the second embodiment that uses λ/4 (=37.75 mm) for the line length of the branching line, and 31 mm for the line length of the line (110) with its front end open.

TABLE 6

The input currents to the Tx terminal are made equal with the antenna terminal opened and terminated in the second embodiment.
(the line length of the branching line = λ/4 (= 37.75 mm))
(the line with its front end open, 31 mm, is added to the antenna terminal)

| Antenna terminal | Input impedance of Tx filter | | Input power to the input terminal of Tx filter | | | Power applied to each arm of Tx filter (Watt) | | | | |
|---|---|---|---|---|---|---|---|---|---|---|
| | Real | Imaginary | Power | Resistance | Current | P1 | P2 | P3 | P4 | P5 |
| 1 Opened | 30.8 | −26.3 | 0.85 | 30.9 | 0.166 | 0.053 | 0.021 | 0.057 | 0.037 | 0.0205 |
| 2 Terminated | 33.5 | −15.8 | 0.93 | 33.5 | 0.166 | 0.053 | 0.021 | 0.057 | 0.037 | 0.0205 |

The second embodiment is a case of 836 MHz in which the line length of the line (110) with its front end open is adjusted so as to make the current inputted to the Tx filter (200) with the ANT terminal (100) opened equal to the current inputted to the Tx filter (200) with the ANT terminal (100) terminated with 50Ω. As illustrated in Table 6, to equalize both currents will equalize the powers applied to the resonators of the Tx filter (200). Table 7 illustrates the powers applied to resonators of the Tx filter (200) in this state with the ANT terminal (100) opened, which are calculated by using the line length of the branching line (400) as the parameter. In Table 7, line lengths are for the branching line 400.

TABLE 7

The power applied to each arm of the Tx filter with the ANT terminal opened and terminated in the second embodiment of the invention

| ANT terminal | Line length (mm) | Input impedance of Tx filter | | Input power to the input terminal of Tx filter | | | Power applied to each arm of Tx filter (Watt) | | | | |
|---|---|---|---|---|---|---|---|---|---|---|---|
| | | Real | Imaginary | Power | Resistance | Current | P1 | P2 | P3 | P4 | P5 |
| 1-1 Opened | 29.2 | 29.7 | −25.7 | 0.85 | 29.7 | 0.169 | 0.055 | 0.015 | 0.078 | 0.003 | 0.032 |
| 1-2 Opened | 37.75 | 21 | −21.6 | 0.78 | 21 | 0.19 | 0.067 | 0.018 | 0.095 | 0.004 | 0.04 |
| 1-3 Opened | 41.7 | 16 | −49.9 | 0.76 | 16 | 0.17 | 0.07 | 0.019 | 0.1 | 0.004 | 0.041 |
| 1-4 Terminated | 37.75 | 25.4 | −19.8 | 0.84 | 25.4 | 0.18 | 0.064 | 0.025 | 0.068 | 0.004 | 0.024 |

Thus, in the second embodiment, it is understood that the powers applied to each of the resonators of the Tx filter (200) are considerably small, when the line length is short. Therefore, in comparison to the powers applied to each of the resonators of the Tx filter (200) with the ANT terminal (100) opened, the powers applied to each of the resonators of the Tx filter (200) with the ANT terminal (100) terminated can be made higher. This condition is preferable to the mobile communication terminals such as portable telephones.

According to the second embodiment as described above, in the mobile communication terminals such as portable telephones, the powers applied to each of the resonators of the Tx filter (200) with the ANT terminal (100) terminated can be made higher than the powers applied to each of the resonators of the Tx filter (200) with the ANT terminal (100) opened, which is preferable to the mobile communication terminals such as portable telephones.

That is, in either case that the antenna (170) is abnormal and the impedance thereof is infinite, or that the antenna (170) is normal and the impedance is 50Ω, it is possible to maintain the characteristics required to the SAW branching filter. Therefore, even if the antenna (170) becomes abnormal and open, the SAW branching filter is able to maintain the normal operation.

In the first and second embodiments, in the mobile communication terminals such as portable telephones, it is confirmed that, when the transmission power is normally applied to each resonator of the Tx filter (200) of the SAW branching filter, and if the antenna is brought into abnormality, the power with the ANT terminal opened can be set equal to or lower than the power with the ANT terminal terminated with 50Ω in the normal operation.

The invention possesses a significant usefulness for the performance enhancement of the mobile communication terminals such as portable telephones.

According to the invention, the power applied to each resonator of the Tx filter (200) with the ANT terminal (100) opened in abnormality can be made lower than the power applied to each resonator of the Tx filter (200) with the ANT terminal (100) terminated with 50Ω, by adjusting the line length of the branching line 400. Thereby, even if the impedance at the ANT terminal (100) is infinite, the filter characteristics can be restrained from deterioration.

According to the invention, the power applied to each resonator of the Tx filter (200) with the ANT terminal (100) opened in abnormality can be made virtually equal to the power applied to each resonator of the Tx filter (200) with the ANT terminal (100) terminated with 50Ω, by providing the line (110) with its front end open in parallel to the ANT terminal (100).

Thereby, even if the impedance at the ANT terminal (100) is infinite, the filter characteristics can be restrained from deterioration.

What is claimed is

1. A surface acoustic wave filter comprising:

an antenna terminal;

an antenna coupled to the antenna terminal;

a transmitting filter coupled to the antenna terminal, the transmitting filter receiving an electrical power;

a branching line coupled to the antenna terminal, the branching line having a first length that is longer than λ/4 length so that the electrical power received by the transmitting filter when the antenna terminal is opened is smaller than when the antenna terminal is terminated, wherein λ is a wave length of a center frequency of transmitted and received bands of the surface acoustic wave filter; and a receiving filter coupled to the branching line.

2. A surface acoustic wave filter as claimed in claim 1, further comprising a power amplifier coupled to apply the electrical power to the transmitting filter.

3. A surface acoustic wave filter as claimed in claim 1, further comprising a low noise amplifier coupled to the receiving filter.

4. A surface acoustic wave filter as claimed in claim 1, wherein the transmitting filter has a plurality of resonators.

5. A surface acoustic wave filter as claimed in claim 4, wherein the transmitting filter is a T-type ladder filter.

6. A surface acoustic wave filter as claimed in claim 1, wherein the receiving filter has a plurality of resonators.

7. A surface acoustic wave filter as claimed in claim 6, wherein the receiving filter is a π-type filter.

8. A surface acoustic wave filter as claimed in claim 1, wherein the λ/4 length is about 37.75 mm and the first length is about 41.7 mm.

9. A surface acoustic wave filter comprising:

an antenna terminal;

a front end open strip line coupled to the antenna terminal, the front end open strip line having a first length that is shorter than λ/4 length, wherein λ is a wave length of a center frequency of transmitted and received bands of the surface acoustic wave filter;

an antenna coupled to the antenna terminal;

a transmitting filter coupled to the antenna terminal, the transmitting filter receiving an electrical power;

a branching line coupled to the antenna terminal, the branching line has a second length that is shorter than λ/4 length so that the electrical power received by the transmitting filter when the antenna terminal is opened is smaller than when the antenna terminal is terminated; and a receiving filter coupled to the branching line.

10. A surface acoustic wave filter as claimed in claim 9, further comprising a low noise amplifier coupled to the receiving filter.

11. A surface acoustic wave filter as claimed in claim 9, wherein the transmitting filter has a plurality of resonators.

12. A surface acoustic wave filter as claimed in claim 11, wherein the transmitting filter is a T-type ladder filter.

13. A surface acoustic wave filter as claimed in claim 9, wherein the receiving filter has a plurality of resonators.

14. A surface acoustic wave filter as claimed in claim 13, wherein the receiving filter is a π-type filter.

15. A surface acoustic wave filter as claimed in claim 9, further comprising a power amplifier coupled to apply the electrical power to the transmitting filter.

16. A surface acoustic wave filter as claimed in claim 9, wherein the $\lambda/4$ length is about 37.75 mm, the first length is about 31.0 mm and the second length is about 29.2 mm.

17. A surface acoustic wave filter comprising:

an antenna terminal;

an antenna coupled to the antenna terminal;

a transmitting filter coupled to the antenna terminal, the transmitting filter receiving an electrical power;

a branching line coupled to the antenna terminal, the branching line having a length longer than $\lambda/4$ length, for adjusting the electrical power received by the transmitting filter so that the electrical power when the antenna terminal is opened is smaller than when the antenna terminal is terminated, wherein $\lambda$ is a wave length of a center frequency of transmitted and received bands of the surface acoustic wave filter; and a receiving filter coupled to the branching line.

18. A surface acoustic wave filter as claimed in claim 17, further comprising a low noise amplifier coupled to the receiving filter.

19. A surface acoustic wave filter as claimed in claim 17, wherein the transmitting filter is a T-type ladder filter.

20. A surface acoustic wave filter as claimed in claim 17, wherein the receiving filter is a π-type filter.

21. A surface acoustic wave filter as claimed in claim 17, further comprising a power amplifier coupled to apply the electrical power to the transmitting filter.

22. A surface acoustic wave filter as claimed in claim 17, wherein the $\lambda/4$ length is about 37.75 mm and the length of the branching line is about 41.7 mm.

* * * * *